United States Patent
Park

(10) Patent No.: US 7,622,360 B2
(45) Date of Patent: Nov. 24, 2009

(54) SHALLOW TRENCH ISOLATION REGION IN SEMICONDUCTOR DEVICE AND METHOD OF MANUFACTURE

(75) Inventor: Keun Soo Park, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 399 days.

(21) Appl. No.: 11/611,551

(22) Filed: Dec. 15, 2006

(65) Prior Publication Data

US 2007/0148909 A1    Jun. 28, 2007

(30) Foreign Application Priority Data

Dec. 28, 2005    (KR) .................. 10-2005-0132089

(51) Int. Cl.
*H01L 21/76* (2006.01)
(52) U.S. Cl. .................. 438/427; 257/E21.548
(58) Field of Classification Search ............. 438/427; 257/E21.548
See application file for complete search history.

(56) References Cited

U.S. PATENT DOCUMENTS 6,838,357 B2 *   1/2005   Chen et al. ................ 438/427

2002/0160610 A1 * 10/2002 Arai et al. .................. 438/692
2005/0269637 A1 * 12/2005 Iwamatsu et al. .......... 257/347
2006/0014361 A1 *  1/2006 Kwon ........................ 438/424

* cited by examiner

*Primary Examiner*—Trung Dang
(74) *Attorney, Agent, or Firm*—Sherr & Vaughn, PLLC

(57) ABSTRACT

A method of forming a device isolation region in a semiconductor device is capable of completely removing an oxide layer for trench formation in a central region of the semiconductor device without forming a moat in an edge region. The method begins with forming a sacrificial oxide and sacrificial nitride layer over a semiconductor substrate. Trenches are etched in the nitride layer, the oxide layer and the substrate in the central and edge regions, respectively. The trenches are filled with an oxide layer. The oxide layer is then polished until the sacrificial nitride layer formed in the edge region is exposed, to form a first device isolation region filling a first trench and a second device isolation region pattern filling a second trench and covering the second region. A photoresist pattern is formed over the first device isolation region and the second device isolation region pattern. The second device isolation region pattern is partially etched using the photoresist pattern as a mask to form a second device isolation region.

12 Claims, 2 Drawing Sheets

SHALLOW TRENCH ISOLATION REGION IN SEMICONDUCTOR DEVICE AND METHOD OF MANUFACTURE

The present application claims priority under 35 U.S.C. 119 and 35 U.S.C. 365 to Korean Patent Application No. 10-2005-0132089 (filed on Dec. 28, 2005), which is hereby incorporated by reference in its entirety.

BACKGROUND

As the degree of integration of semiconductor devices increase, there has been interest in methods for reducing the size of all components and elements integrated on a semiconductor substrate. One particular area of interest is in optimizing a technology for reducing a shallow trench isolation region, which occupies considerable area on a semiconductor device.

The device isolation region may be formed by a local oxidation of silicon (LOCOS) method or a shallow trench isolation method (STI).

In the LOCOS method, a nitride layer and an oxide mask defining an active region is formed. A predetermined region of a substrate is oxidized to form a device isolation region. The oxidation process progresses not only vertically within the substrate, but also horizontally, which causes an undesirable region of oxide geometrically isomorphic to a bird's beak. This horizontal spreading of the isolation region decreases the usable area of the active region.

In the STI method, a trench is formed in a predetermined region of a semiconductor substrate and is filled with an oxide material to a great thickness. A chemical mechanical polishing (CMP) then completes the device isolation region. However, when the oxide material is deposited, the thickness of the oxide layer varies between the edge region of the semiconductor substrate and the central region. The oxide layer in the central region is thicker than that in the edge region.

Accordingly, if the polishing is performed to planarize the edge region, an unplanarized oxide layer remains in the central region. Conversely, if the polishing is performed to planarize the central region, a moat is formed in the trench in the edge region.

Ideally, when a device isolation region is formed in a semiconductor substrate, the oxide layer in the central region is completely removed without forming a moat in the trenches in the edge region.

SUMMARY

Accordingly, embodiments are directed to a shallow trench isolation region in a semiconductor device, and a manufacturing method that substantially obviates one or more problems due to the limitations and disadvantages of the related art.

Embodiments relate to a method of forming a device isolation region in a semiconductor device, capable of completely removing an oxide layer for trench formation in a central region of the semiconductor device without forming a moat in an edge region thereof.

Additional advantages, objects, and features of the embodiments will be set forth in part in the description which follows and in part will become apparent to those having ordinary skill in the art upon examination of the following or may be learned from practical experience with the disclosed embodiments. Advantages of the embodiments may be realized and attained by the structure particularly pointed out in the written description and claims hereof as well as the appended drawings.

Embodiments relate to a method for forming a device isolation region of a semiconductor device. The method begins with forming a sacrificial oxide layer and a sacrificial nitride layer over a semiconductor substrate. The substrate has an edge region and an central region. Portions of the sacrificial nitride layer, the sacrificial oxide layer and the substrate are selectively etched to form first and second trenches having predetermined depths in the central and edge regions, respectively. The first and second trenches are filled with an oxide layer. The oxide layer is then polished until the sacrificial nitride layer formed in the edge region is exposed, to form a first device isolation region filling the first trench and a second device isolation region pattern filling the second trench and covering the second region. A photoresist pattern is formed over the first device isolation region and the second device isolation region pattern. The second device isolation region pattern is partially etched using the photoresist pattern as a mask to form a second device isolation region.

It is to be understood that both the foregoing general description and the following detailed description of the embodiments are exemplary and explanatory and are intended to provide further explanation of the embodiments as claimed.

BRIEF DESCRIPTION OF THE DRAWINGS

Example

DETAILED DESCRIPTION

Figure 1:
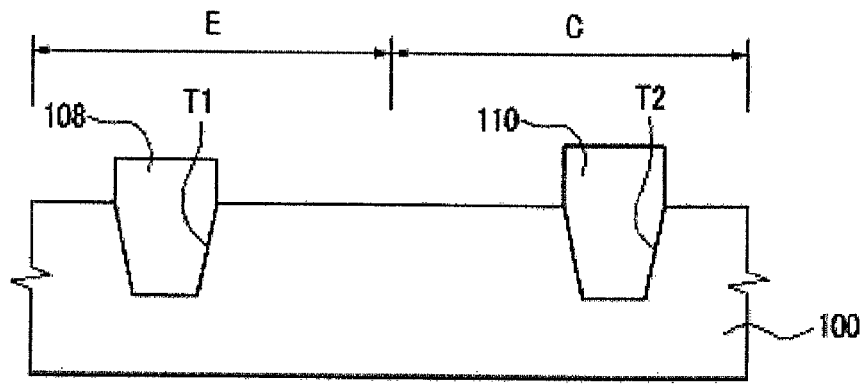
FIG. 1 is a cross-sectional view showing a device isolation region of a semiconductor device according to embodiments; and Example

Referring to FIG. 1, device isolation regions 108 and 110 defining an active region are formed in a semiconductor substrate 100 divided into a central region C and an edge region E. The device isolation regions 108 and 110 are formed of an oxide material filling trenches T1 and T2 formed in the semiconductor substrate 100, respectively.

The second device isolation region 110 in the central region C protrudes further than the first device isolation region in the edge region E.

A method for forming device isolation regions will now be described in detail with reference to FIGS. 2 through 6.

Example FIGS. 2 through 6 are views for describing a method of forming a device isolation region of a semiconductor device according to embodiments.

Figure 2:
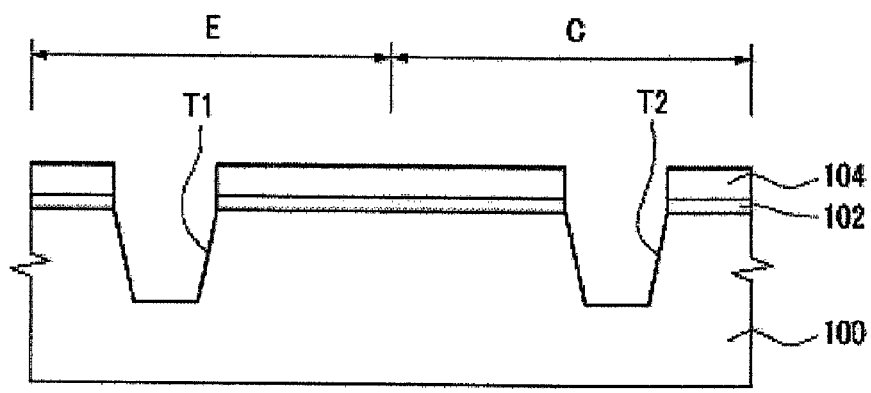
FIGS. 2 through 6 are views for describing a method of forming a device isolation region of a semiconductor device according to embodiments.

Referring to FIG. 2, a sacrificial oxide layer 102 and a sacrificial nitride layer 104 are formed over a semiconductor substrate 100.

Then, the sacrificial nitride layer 104, the sacrificial oxide layer 102, and the semiconductor substrate 100 are etched through a selective etching process, thereby forming first and second trenches T1 and T2.

Figure 3:
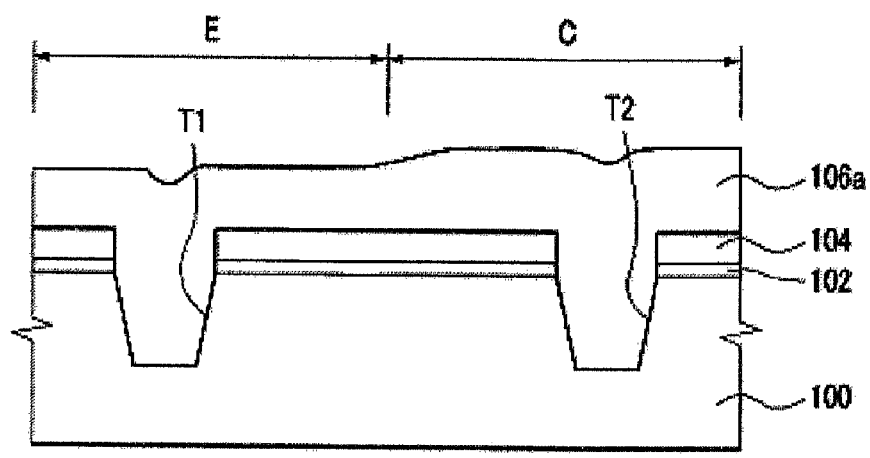

As illustrated in FIG. 3, an oxide layer 106a is formed by a chemical vapor deposition (CVD) method to fill the trenches T1 and T2. The thickness of the oxide layer 106 is sufficiently thick, and the oxide layer 106 in a central region C may be greater than that in an edge region E, for example, by about 200 Å. Before the oxide layer 106a is formed, the substrate 100 may be oxidized to cure the insides of the trenches T1 and T2 damaged by etching, thereby forming a thermal oxide layer (not shown).

Figure 4:
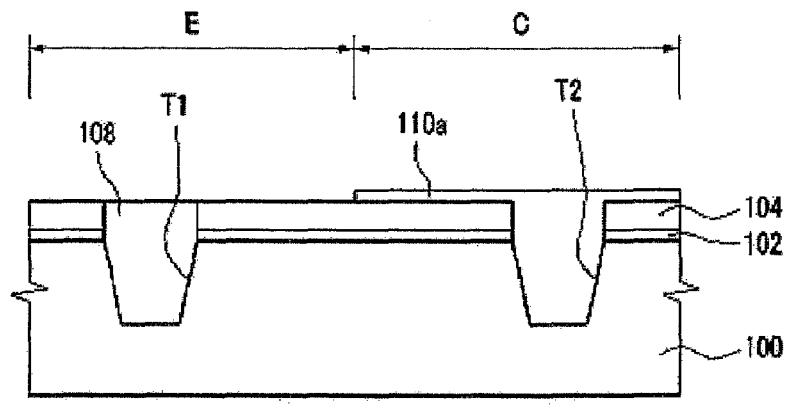

Thereafter, as illustrated in FIG. 4, the substrate 100 is planarized by a CVD method to form a device isolation region 108 in the edge region E, and a second device isolation region pattern 110a in the central region C.

The polishing is performed until the sacrificial nitride layer 104 in the edge region E is exposed, minimizing a height difference between the second device isolation region pattern 110a and the first device isolation region 108.

Because of characteristics of the CVD deposition process, the oxide layer 106a in the central region C is thicker than that in the edge region E of the substrate. For this reason, when the substrate is polished until the sacrificial nitride layer 104 in the edge region E is exposed, the oxide layer in the central region C is left, without exposing the nitride layer in the central region C, thereby forming the second device isolation region pattern 110a.

In embodiments, to completely remove the oxide layer 106a in the edge region E, the polishing time may be extended an extra 2~3% over the polishing time it takes to first expose the sacrificial nitride layer 104 in the edge region E. In embodiments, to completely remove the oxide layer 106a in the edge region E, the polishing time may be extended about an extra 4-7% over the polishing time it takes to first expose the sacrificial nitride layer 104 in the edge region E. However, even in this case, the sacrificial nitride layer in the central region C is not exposed. For example, when it takes 110 seconds of polishing to expose the sacrificial nitride layer, polishing may be extended for 5 to 7 seconds, corresponding to about 4-7% of 110 seconds.

Figure 5:
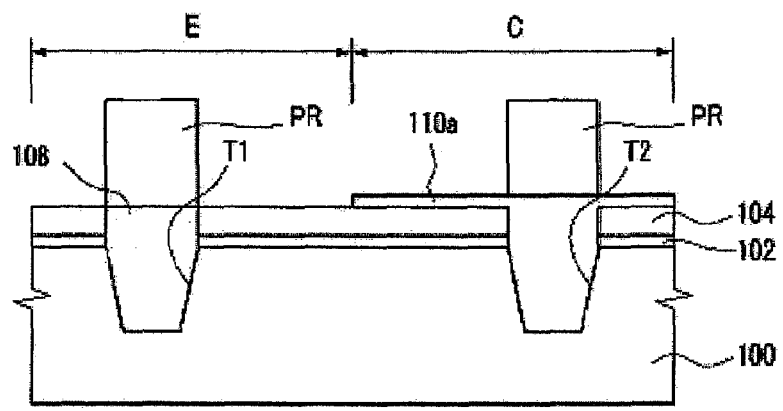

Thereafter, as illustrated in FIG. 5, a photoresist layer is formed over the substrate 100, and exposure and development are performed to form photoresist patterns PR.

Figure 6:
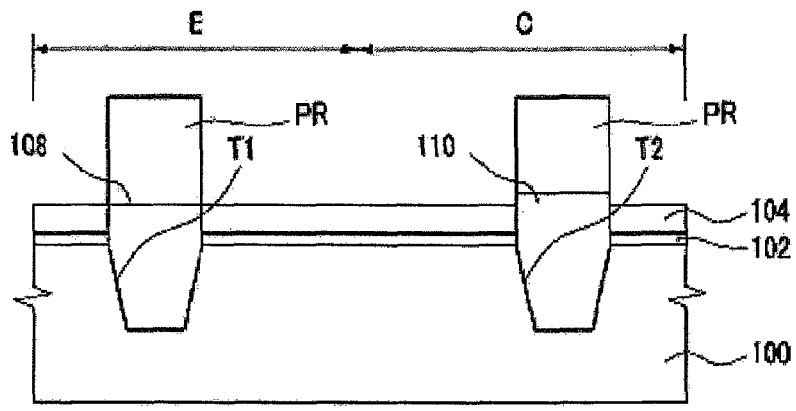

Next, as illustrated in FIG. 6, the second device isolation region pattern 110a is etched using the photoresist pattern PR as a mask to complete a second device isolation region 110 in the central region C. Although the second device isolation region 110 may protrude further than the first device isolation region 108, this does not affect an electrical characteristic of the semiconductor device since the polishing is performed to minimize the height difference therebetween.

The etching is performed using a gas mixture of, for example, $SH_6$, HBr, $Cl_2$, $H_2$ and $O_2$, satisfying the condition of great etching selectivity with respect to the nitride layer and the oxide layer.

Thereafter, as illustrated in FIG. 1, the photoresist pattern PR is removed. Then, the sacrificial nitride layer 104 and the sacrificial oxide layer 102 are removed.

A process of forming a transistor is then performed on an active region.

As described so far, since the device isolation region in the central region is completed through a selective etching process, a moat caused by over-polishing and/or over-etching of the edge region does not occur, and the oxide layer in the central region is completely removed. Thus, a high-quality semiconductor device can be provided.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method for forming a device isolation region of a semiconductor device, the method comprising:
   forming a sacrificial oxide layer and a sacrificial nitride layer over a semiconductor substrate, the substrate having a first region and a second region;
   selectively etching portions of the sacrificial nitride layer, the sacrificial oxide layer and the substrate to form first and second trenches having predetermined depths in the first and second regions, respectively;
   filling the first and second trenches with an oxide layer;
   polishing the oxide layer until the sacrificial nitride layer formed in the first region is exposed, to form a first device isolation region filling the first trench and a second device isolation region pattern filling the second trench and covering the second region;
   forming a photoresist pattern over the first device isolation region and the second device isolation region pattern; and
   partially etching the second device isolation region pattern using the photoresist pattern as a mask to form a second device isolation region.

2. The method according to claim 1, further comprising removing the photoresist pattern, the sacrificial nitride layer, and the sacrificial oxide layer after the forming of the second device isolation region.

3. The method according to claim 1, wherein the first region is an edge region of the semiconductor substrate, and the second region is a central region of the semiconductor substrate.

4. The method according to claim 1, wherein the second region is closer to the geometric center of the semiconductor substrate than the first region.

5. The method according to claim 1, wherein the polishing of the oxide layer is chemical mechanical polishing.

6. The method according to claim 1, wherein the polishing is performed for an additional 2 to 3% of the time it takes to expose the sacrificial nitride layer in the first region.

7. The method according to claim 1, wherein the polishing is performed for an additional 4 to 7% of the time it takes to expose the sacrificial nitride layer in the first region.

8. The method according to claim 2, wherein the first region is an edge region of the semiconductor substrate, and the second region is a central region of the semiconductor substrate.

9. The method according to claim 2, wherein the second region is closer to the geometric center of the semiconductor substrate than the first region.

10. The method according to claim 2, wherein the polishing of the oxide layer is chemical mechanical polishing.

11. The method according to claim 2, wherein the polishing is performed for an additional 2 to 3% of the time it takes to expose the sacrificial nitride layer in the first region.

12. The method according to claim 2, wherein the polishing is performed for an additional 4 to 7% of the time it takes to expose the sacrificial nitride layer in the first region.

* * * * *